United States Patent
Mulfinger et al.

(10) Patent No.: US 8,033,835 B2
(45) Date of Patent: Oct. 11, 2011

(54) INTERCONNECT ASSEMBLY HAVING A SEPARABLE MATING INTERFACE

(75) Inventors: Robert Neil Mulfinger, York Haven, PA (US); Jason M'Cheyne Reisinger, Carlisle, PA (US); Richard Elof Hamner, Hummelstown, PA (US); Steven J. Millard, Mechanicsburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/642,056

(22) Filed: Dec. 18, 2009

(65) Prior Publication Data
US 2011/0151687 A1 Jun. 23, 2011

(51) Int. Cl.
*H01R 12/00* (2006.01)
*H05K 1/00* (2006.01)

(52) U.S. Cl. ............................ 439/66; 439/91; 439/591

(58) Field of Classification Search .................. 439/66, 439/91, 591
See application file for complete search history.

(56) References Cited

U.S. PATENT DOCUMENTS

| | | |
|---|---|---|
| 4,085,990 A | 4/1978 | Jayne |
| 4,518,210 A | 5/1985 | Morrison |
| 4,603,928 A | 8/1986 | Evans |
| 4,626,056 A | 12/1986 | Andrews, Jr. et al. |
| 4,629,270 A | 12/1986 | Andrews, Jr. et al. |
| 4,731,698 A | 3/1988 | Millot et al. |
| 4,840,569 A | 6/1989 | Cabourne |
| 5,092,781 A | 3/1992 | Casciotti et al. |
| 5,102,342 A | 4/1992 | Marian |
| 5,171,154 A | 12/1992 | Casciotti et al. |
| 5,228,863 A | 7/1993 | Campbell et al. |
| 5,772,451 A | 6/1998 | Dozier, II et al. |
| 6,062,872 A | 5/2000 | Strange et al. |
| 6,077,090 A | 6/2000 | Campbell et al. |
| 6,411,517 B1 | 6/2002 | Babin |
| 6,672,878 B2 | 1/2004 | Dean |
| 6,877,992 B2 * | 4/2005 | Grant et al. ..................... 439/66 |
| 6,916,181 B2 * | 7/2005 | Brown et al. ................... 439/66 |
| 6,945,788 B2 | 9/2005 | Trout et al. |
| 6,957,963 B2 * | 10/2005 | Rathburn ........................ 439/66 |
| 7,044,746 B2 | 5/2006 | Copper et al. |
| 7,114,961 B2 | 10/2006 | Williams |
| 7,284,992 B2 * | 10/2007 | Becker et al. ................... 439/66 |
| 7,297,015 B1 | 11/2007 | Desrosiers et al. |
| 7,331,796 B2 * | 2/2008 | Hougham et al. .............. 439/66 |
| 7,374,441 B2 | 5/2008 | Rubenstein |
| 7,396,236 B2 * | 7/2008 | Eldridge et al. ................ 439/66 |
| 7,419,400 B1 | 9/2008 | Taylor et al. |
| 7,425,134 B1 | 9/2008 | Taylor |
| 7,438,582 B2 | 10/2008 | Taylor |
| 7,473,102 B2 * | 1/2009 | Colgan et al. .................. 439/66 |
| 7,789,668 B1 * | 9/2010 | Hamner et al. ................. 439/65 |

(Continued)

*Primary Examiner* — Hae Moon Hyeon (57) ABSTRACT

An interconnect assembly for interconnecting first and second electrical components includes a substrate having opposed first and second surfaces and a first array of contacts on the first surface for engaging corresponding elements on the first electrical component. The first array of contacts defines a compressible interface that mates with the first electrical component. The first array of contacts includes signal contacts transferring data signals across the compressible interface and the first array of contacts includes a combination of power contacts that jointly convey power across the compressible interface. The interconnect assembly also includes a second array of contacts on the second surface for engaging corresponding elements on the second electrical component. The second array of contacts having signal contacts electrically connected to the signal contact of the first array of contacts and power contacts electrically connected to the power contacts of the second array of contacts.

20 Claims, 8 Drawing Sheets

U.S. PATENT DOCUMENTS

| | | |
|---|---|---|
| 7,789,669 B1 * | 9/2010 | Duesterhoeft et al. .......... 439/65 |
| 7,887,336 B2 * | 2/2011 | Nikaido et al. ................. 439/66 |
| 2002/0055282 A1 * | 5/2002 | Eldridge et al. ................ 439/66 |
| 2005/0233609 A1 * | 10/2005 | Rathburn ........................ 439/66 |
| 2007/0020960 A1 * | 1/2007 | Williams ........................ 439/66 |
| 2007/0097662 A1 | 5/2007 | Dean |
| 2008/0227314 A1 | 9/2008 | Taylor |
| 2010/0081342 A1 * | 4/2010 | Nikaido et al. ............... 439/709 |
| 2011/0070750 A1 * | 3/2011 | Reisinger et al. ............... 439/66 |

* cited by examiner

INTERCONNECT ASSEMBLY HAVING A SEPARABLE MATING INTERFACE

BACKGROUND OF THE INVENTION

The subject matter herein relates generally to an interconnect assembly for interconnecting multiple electrical components, and more particularly, to an interconnect assembly having a separable mating interface.

Some electrical systems, such as servers, routers, and data storage systems, utilize electrical connector assemblies for transmitting signals and/or power through the electrical system. One particular application is a backplane and daughtercard application. The electrical connector assemblies are used to interconnect various electrical components together, such as circuit boards (e.g. backplane and daughtercard boards), chip carriers or similar substrates that are circuitized or metallized. The electrical components typically have a grid array of contacts, to which the electrical connector assemblies are connected. The electrical connector assemblies typically include a substrate having contacts arranged on both sides thereof for interfacing with the grid arrays of the electrical components.

However, known electrical connector assemblies are not without disadvantages. For instance, the interfaces typically only include one type of contact, namely signal contacts, which are mated to the electrical components. When it is required to transfer power between the electrical components, a separate connector is used and mated to transfer power between the electrical components. Such a situation complicates mating of the electrical components and increases the overall cost of the system. Therefore, a need exists for an electrical interface assembly that is capable of transferring both signal and power across the mating interface.

BRIEF DESCRIPTION OF THE INVENTION

In one embodiment, an interconnect assembly is provided for interconnecting first and second electrical components that includes a substrate having opposed first and second surfaces and a first array of contacts on the first surface for engaging corresponding elements on the first electrical component. The first array of contacts defines a compressible interface that mates with the first electrical component. The first array of contacts includes signal contacts transferring data signals across the compressible interface and the first array of contacts includes a combination of power contacts that jointly convey power across the compressible interface. The interconnect assembly also includes a second array of contacts on the second surface for engaging corresponding elements on the second electrical component. The second array of contacts having signal contacts electrically connected to the signal contact of the first array of contacts and power contacts electrically connected to the power contacts of the second array of contacts.

Optionally, the compressible interface defined by the first array of contacts may be separable from the first electrical component such that both the signal contacts and the power contacts are configured to be separated from the first electrical component when the substrate and the first electrical component are moved apart from one another. The substrate may include a circuit board having vias extending between the first and second surfaces, where the signal contacts of the first array of contacts are electrically connected to corresponding signal contacts of the second array of contacts through corresponding vias, and where the power contacts of the first array of contacts are electrically connected to the power contacts of the second array of contacts through the vias.

Optionally, the power contacts may be electrically connected to one another by a common plate. The metal plate may be provided at the first surface of the substrate, and the power contacts may be integrally formed with the metal plate. A metal heat sink may be directly connected to the power contacts, with the heat sink dissipating heat from the power contacts. Optionally, the interconnect assembly may include a first metal plate at the first surface of the substrate and a second metal plate at the second surface of the substrate, with the first and second metal plates being electrically connected to one another by plated via holes through the substrate. The power contact of the first array of contacts may be electrically connected to, and may extend outward from, the first metal plate, and the power contact of the second array of contacts may be electrically connected to, and may extend outward from, the second metal plate.

Optionally, the power and signal contacts of the first array of contacts may have a similar size and shape. The power and signal contacts of the first array of contacts may have a similar cross-sectional area and a similar contact area for interfacing with the first electrical component. The power and signal contacts of the first array of contacts may have a similar current rating such that the current carrying capacity of the power contacts substantially corresponds to the current carrying capacity of the signal contacts.

Optionally, the signal contacts may have a longitudinal pitch and a lateral pitch between adjacent signal contacts, and the power contacts may have a longitudinal pitch and a lateral pitch between adjacent power contacts, where the longitudinal and lateral pitches of the power contacts may be tighter than the longitudinal and lateral pitches of the signal contacts. A coverlay may overlie the first array of contacts that includes a plurality of openings, where the signal contacts and the power contacts are arranged within corresponding ones of the plurality of openings, and where tips of the signal contacts and power contacts are positioned outward of the coverlay for mating engagement with the first electrical component. The power contacts may be configured to engage and mate with the first electrical component before the signal contacts in a sequenced mating scheme.

In another embodiment, an interconnect assembly for interconnecting first and second electrical components is provided including a substrate having opposed first and second surfaces. Signal contacts define a first signal interface at the first surface for engaging corresponding elements on the first electrical component. The signal contacts define a second signal interface at the second surface for engaging corresponding elements on the second electrical component. Power contacts transfer power through the substrate. The power contacts are similarly sized as the signal contacts and the power contacts are similarly shaped as the signal contacts. The power contacts are configured to engage corresponding elements on the first and second electrical components to transfer power between the first and second electrical components.

In a further embodiment, an interconnect assembly is provided for interconnecting first and second electrical components. The interconnect assembly includes a substrate having opposed first and second surfaces. A first array of contacts is provided on the first surface for engaging corresponding elements on the first electrical component. The first array of contacts defines a compressible interface that mates with the first electrical component. The first array of contacts includes signal contacts transferring data signals across the compressible interface and the first array of contacts includes power contacts transferring power across the compressible interface. The power contacts are electrically connected to one another by a common plate on the first surface. A second array of contacts is provided on the second surface for engaging corresponding elements on the second electrical component.

DETAILED DESCRIPTION OF THE INVENTION

Figure 1:
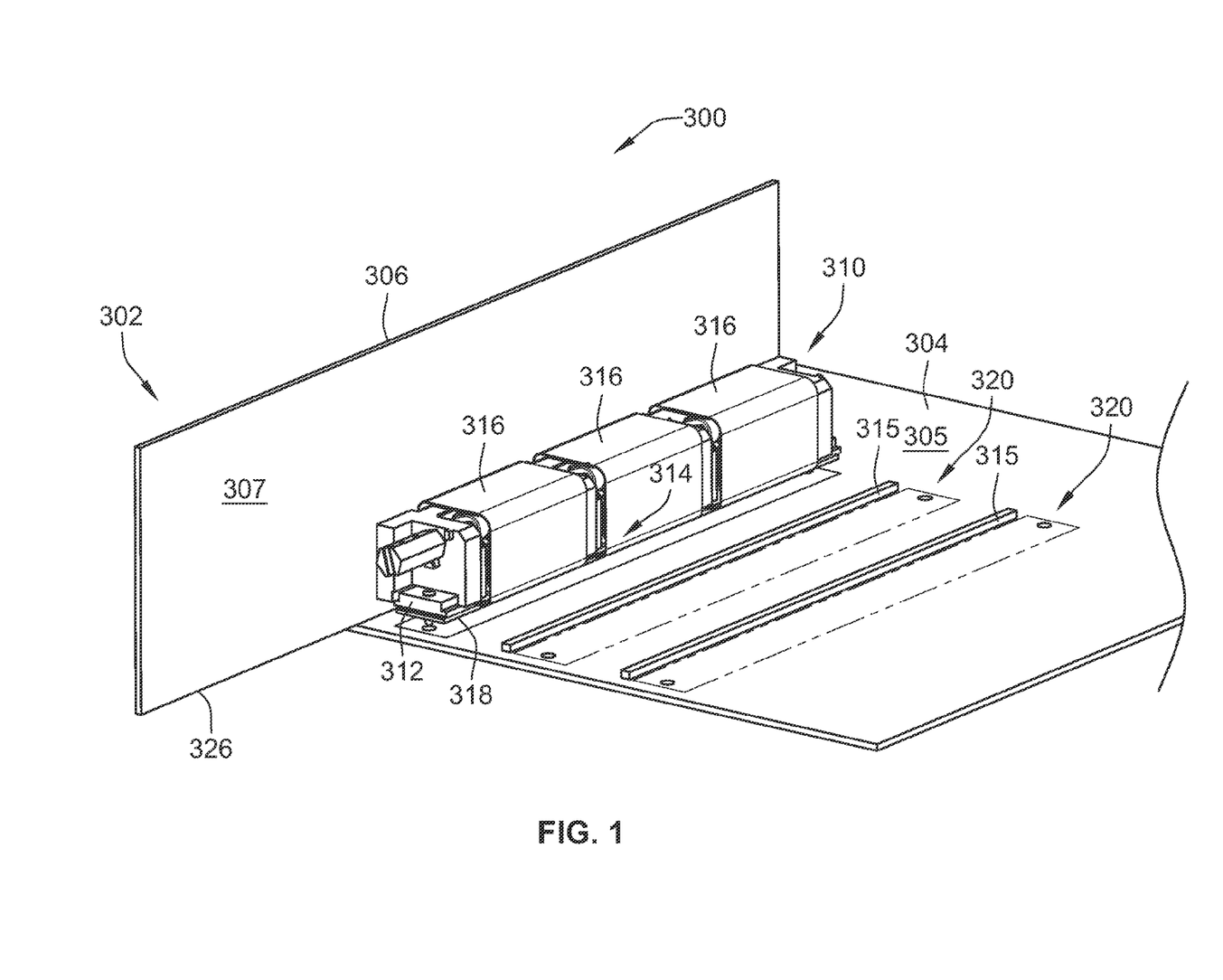
FIG. 1 is a perspective view of an electrical system formed in accordance with one embodiment.

FIG. 1 is a perspective view of an electrical system 300 formed in accordance with one embodiment that includes an electrical connector assembly 310 used to interconnect first and second electrical components 304, 306 together. In the illustrated embodiment, the first electrical component 304 represents a circuit board and may be referred to hereinafter as a primary circuit board 304. The second electrical component 306 also represents a circuit board and may be referred to hereinafter as a secondary circuit board 306. The electrical connector assembly 310 may be used to interconnect electrical components other than circuit boards together in alternative embodiments. As described in further detail below, the electrical connector assembly 310 may be configured to transmit both power and data between the first and second electrical components 304, 306.

The secondary circuit board 306 has a mating surface 307 and the electrical connector assembly 310 is coupled to the surface 307 of the secondary circuit board 306. The secondary circuit board 306 and the electrical connector 310 together define a removable card connector assembly 302 that is removably coupled to the primary circuit board 304. The electrical connector assembly 310 includes a separable mating interface 312 that is configured to be separably coupled to the primary circuit board 304. In particular, the mating interface 312 is configured to be mated with a system contact array 320 of contacts along a surface 305 of the primary circuit board 304. Both power and data may be transferred across the separable mating interface 312. The system contact array 320 includes both power and signal contacts that are mated with corresponding power and signal contacts of the electrical connector assembly 310.

As one example for the electrical system 300, the card connector assembly 302 may be a part of a server blade and the primary circuit board 304 may be a mother board of a server system. However, the electrical system 300 shown in FIG. 1 may be a variety of other electrical systems, such as a router system or data storage system. Furthermore, although the illustrated embodiment is described with reference to interconnecting the primary and secondary circuit boards 304 and 306, the description herein is not intended to be limited to circuit boards. Embodiments described herein may be used to interconnect other electrical components where one component has an array of contacts and the other component has a complementary array of contacts. For example, embodiments described herein may be used as an interconnect assembly between an electrical component such as a circuit board and an integrated circuit (IC) component, such as a chip.

The card connector assembly 302 is positioned with respect to the primary circuit board 304 by advancing the card connector assembly 302 in a longitudinal mating direction along the primary circuit board 304. For example, the card connector assembly 302 may slidably engage guiding features 315, and slide to a predetermined position and orientation with respect to the contact array 320. Once the card connector assembly 302 is properly positioned alongside the contact array 320, the mating interface 312 may be moved to engage the contact array 320.

The electrical connector assembly 310 includes a circuit assembly 314 having the mating interface 312, one or more moveable interconnect assemblies 318, and one or more flexible circuits 316. The circuit assembly 314 communicatively couples the primary and secondary circuit boards 304 and 306 by providing conductive paths therebetween. The electrical connector assembly 310 transfers both power and data between the primary and secondary circuit boards 304, 306. The interconnect assemblies 318 are configured to be moved toward and away from the contact array 320 of contacts on the primary circuit board 304. As will be discussed in greater detail below, embodiments described herein are configured to move the interconnect assembly 318 between a retracted or disengaged position and an engaged position. When in the engaged position, the electrical connector assembly 310 is electrically coupled to the contact array 320 through the interconnect assembly 318. Accordingly, the electrical connector assembly 310 is configured to interconnect the primary and secondary circuit boards 304 and 306. Power and data may both be transmitted by the electrical connector assembly 310 between the primary and second circuit boards 304 and 306. The power and data connection with the primary circuit board 304 is made substantially simultaneously during the same mating procedure. For example, the interconnect assembly 318 includes both power and data contacts that are moved into engagement with the corresponding contacts on the primary circuit board 304 at the same time as the electrical connector assembly 310 is moved to the engaged position. The electrical connector assembly 310 may be similarly moved to the disengaged position by separating the interface with the primary circuit board 304. The electrical connector assembly 310 and secondary circuit board 306 may be removed from the electrical system 300 when disengaged from the primary circuit board 304.

As shown in FIG. 1, the electrical connector assembly 310 is affixed to the secondary circuit board 306 and movable to engage the primary circuit board 304. However, in alternative embodiments, the electrical connector assembly 310 may be affixed to the primary circuit board 304 and be configured to engage a secondary circuit board when the secondary circuit board is inserted into the electrical system 300.

Figure 2:
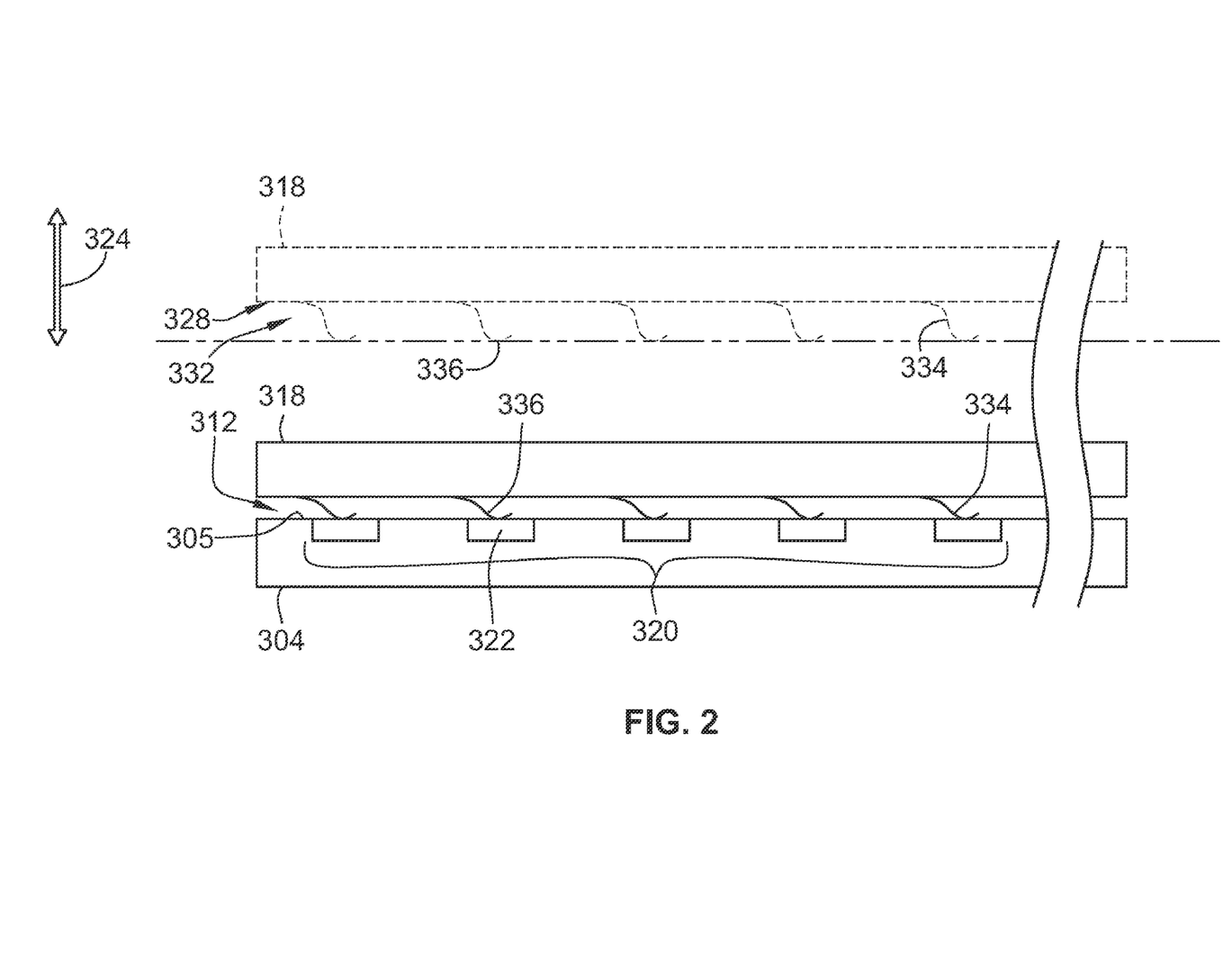
FIG. 2 is a cross-sectional view of a primary circuit board and a moveable interconnect assembly that may be used with the electrical system shown in FIG. 1.

FIG. 2 is a cross-sectional view illustrating the interconnect assembly 318 in a disengaged position (shown in dashed lines) and in an engaged position (solid lines) with respect to the primary circuit board 304. The circuit assembly 314

(shown in FIG. 1) is configured to allow the interconnect assembly 318 to be moved bi-directionally in a linear manner between the disengaged position and the engaged position, shown generally by the arrow 324. As shown, the contact array 320 of the primary circuit board 304 has individual contacts 322 and the interconnect assembly 318 has a corresponding array of contacts 332.

In an exemplary embodiment, the array of contacts 332 includes both signal contacts 334 and power contacts 336. The signal contacts 334 transfer data signals across the mating interface 312. The power contacts 336 transfer power across the mating interface 312. Optionally, the signal and power contacts 334, 336 may have different lengths such that mating interfaces of the signal contacts 334 engage the corresponding contacts 322 at different stages of mating as compared to the power contacts 336. For example, the power contacts 336 may be longer than the signal contacts 334 so that the power contacts 336 mate prior to the signal contacts 334. A sequenced mating interface is defined by the different length contacts 334, 336.

In the disengaged position, the array of contacts 332 of the interconnect assembly 318 is spaced from corresponding contacts 322 of the primary circuit board 304. In the engaged position, each of the signal contacts 334 and the power contacts 336 engage and are electrically coupled to corresponding ones of the contacts 322 of the primary circuit board 304. The interconnect assembly 318 may be held and moved toward the primary circuit board 304 until the corresponding contacts 322, 334, 336 are engaged. The interconnect assembly 318 may also be disengaged from the primary circuit board 304.

The interconnect assembly 318 may be moved toward the primary circuit board 304 in a linear manner. Alternatively, the interconnect assembly 318 may be moved toward and engage the primary circuit board 304 in a non-linear manner. For example, the interconnect assembly 318 may approach the primary circuit board 304 at an angle or along an arcuate path until the contacts 334, 336 are aligned with and engage the contacts 332. The board surface 305 and the mating surface 328 may not be parallel when in the disengaged position, but may become aligned and parallel with each other when the interconnect assembly 318 is in the engaged position.

Figure 3:
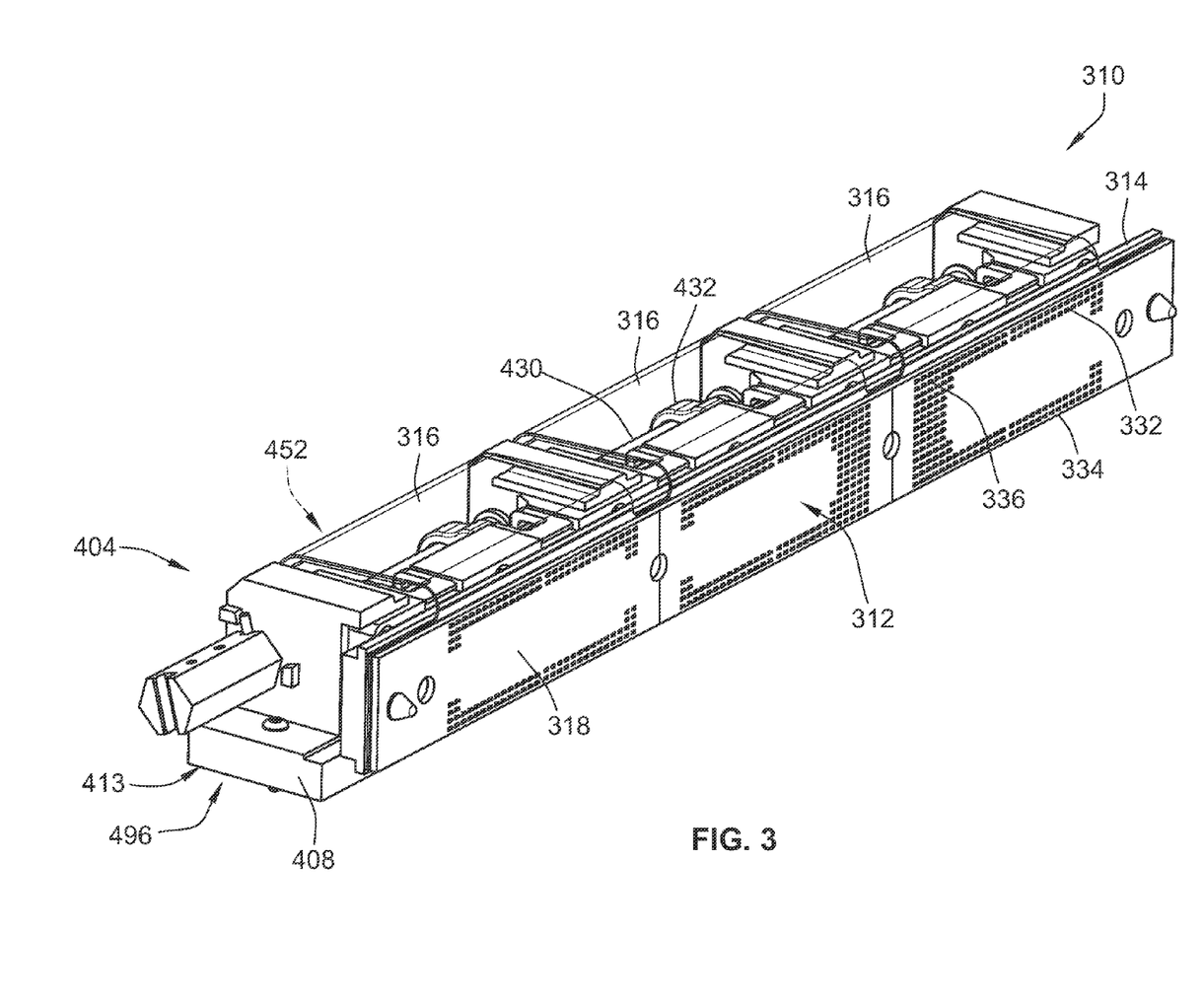
FIG. 3 is a front perspective view of an electrical connector assembly for the electrical system shown in FIG. 1.

FIG. 3 is a front perspective view of the mating interface 312 of the electrical connector assembly 310. The electrical connector assembly 310 may include a base frame 408 and a coupling mechanism 404 that is supported by the base frame 408. The base frame 408 may be coupled (e.g., fastened) to the secondary circuit board 306 (shown in FIG. 1) so that the base frame 408 has a fixed relationship with respect to the secondary circuit board 306. The electrical connector assembly 310 includes the circuit assembly 314 that includes the flexible circuits 316 coupled to the mating interface 312. The circuit assembly 314 also includes the interconnect assembly 318 and another interconnect assembly 413. The interconnect assembly 318 includes an array of contacts 332, which includes both the signal contacts 334 and the power contacts 336. The flexible circuits 316 (also called flex circuit sections) are coupled to the interconnect assembly 413 at a board side 496 of the electrical connector assembly 310 and extend around the electrical connector assembly 310 to the mating interface 312.

The coupling mechanism 404 is configured to move the mating interface 312 between the disengaged and engaged positions. The coupling mechanism 404 includes an axle 430 and cams 432 coupled to the axle 430. The cams 432 are either directly or indirectly coupled to the interconnect assembly 318. The axle 430 is rotated to move the cams 432, and thus the mating interface 312 between the disengaged and engaged positions. Other types of mechanisms may be used in alternative embodiments to move the separable interface at the mating interface 312 between the disengaged and engaged positions.

Figure 4:
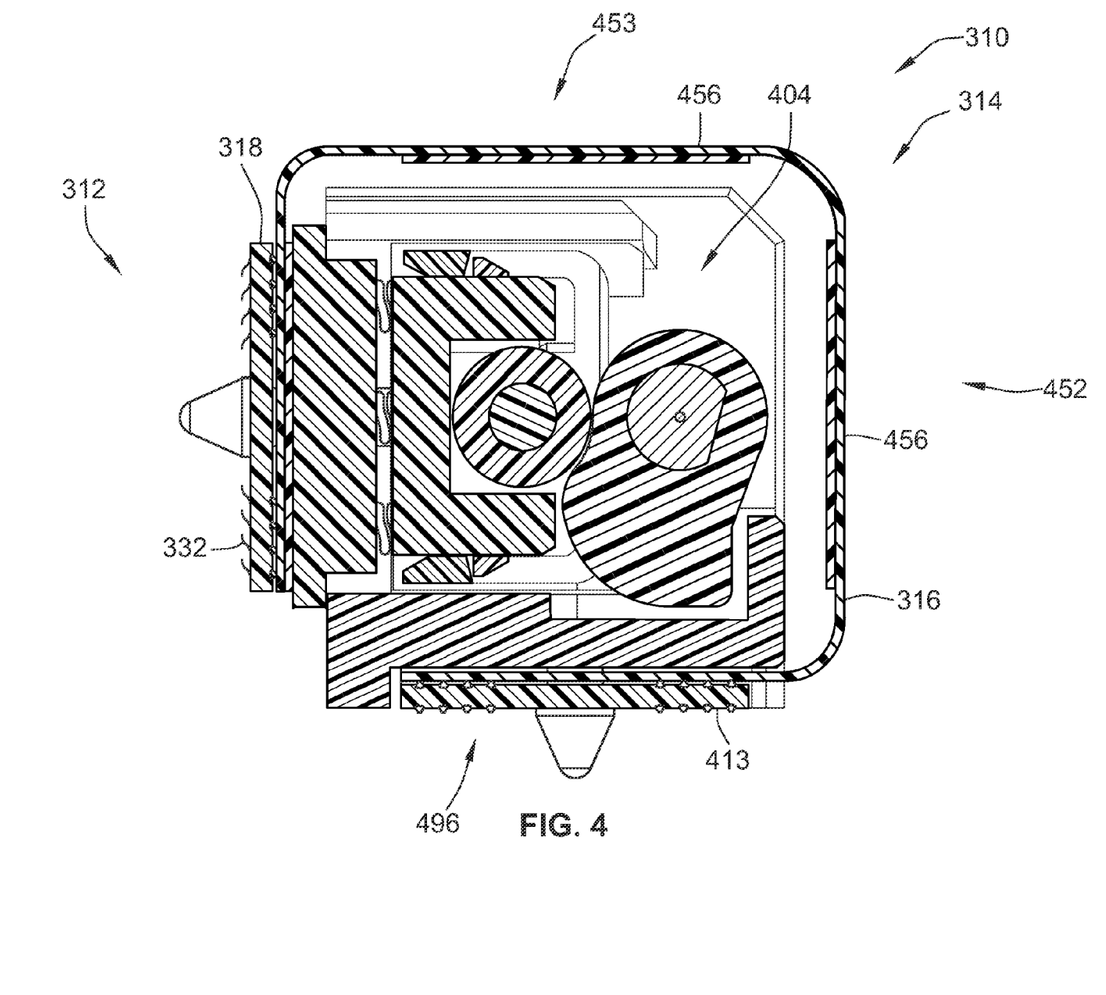
FIG. 4 is a cross-sectional view of the electrical connector assembly shown in FIG. 3.

FIG. 4 is cross-sectional view of the electrical connector assembly 310. As shown, the flexible circuit 316 extends around the coupling mechanism 404 to communicatively couple the interconnect assembly 413 on the board side 496 to the interconnect assembly 318 of the mating interface 312. More specifically, the flexible circuit 316 extends around a perimeter of the cross-section of the electrical connector assembly 310 from the interconnect assembly 413 along non-mating sides 452 and 453. The flexible circuit 316 and/or the circuit assembly 314 may include rigid substrates or board stiffeners 456 for supporting and providing a shape to the flexible circuit 316.

The interconnect assemblies 318 and 413 and the flexible circuit 316 of the circuit assembly 314 may be assembled together into one unit. The interconnect assembly 413 extends between and engages the flexible circuit 316 on one side of the interconnect assembly 413 and the secondary circuit board 306 (shown in FIG. 1) on the other side of the interconnect assembly 413. The contacts of the interconnect assembly 413 may include contact beams, press-fit contacts or solder-ball contacts that are affixed to the secondary circuit board 306 to maintain an electrical connection with the secondary circuit board 306. Alternatively, other types of contacts may be used.

The mating interface 312 includes the interconnect assembly 318. The interconnect assembly 318 engages the flexible circuit 316 on one side of the interconnect assembly 318 and engages the primary circuit board 304 (shown in FIG. 1) on the other side of the interconnect assembly 318. The signal and power contacts 334, 336 of the interconnect assembly 318 include beams extending from the interconnect assembly 318 for engaging the primary circuit board 304. Alternatively, the signal and power contacts 334, 336 may be formed from part of the flexible circuit 316, such as traces along a flexible substrate, for direct engagement with the primary circuit board 304.

Figure 5:
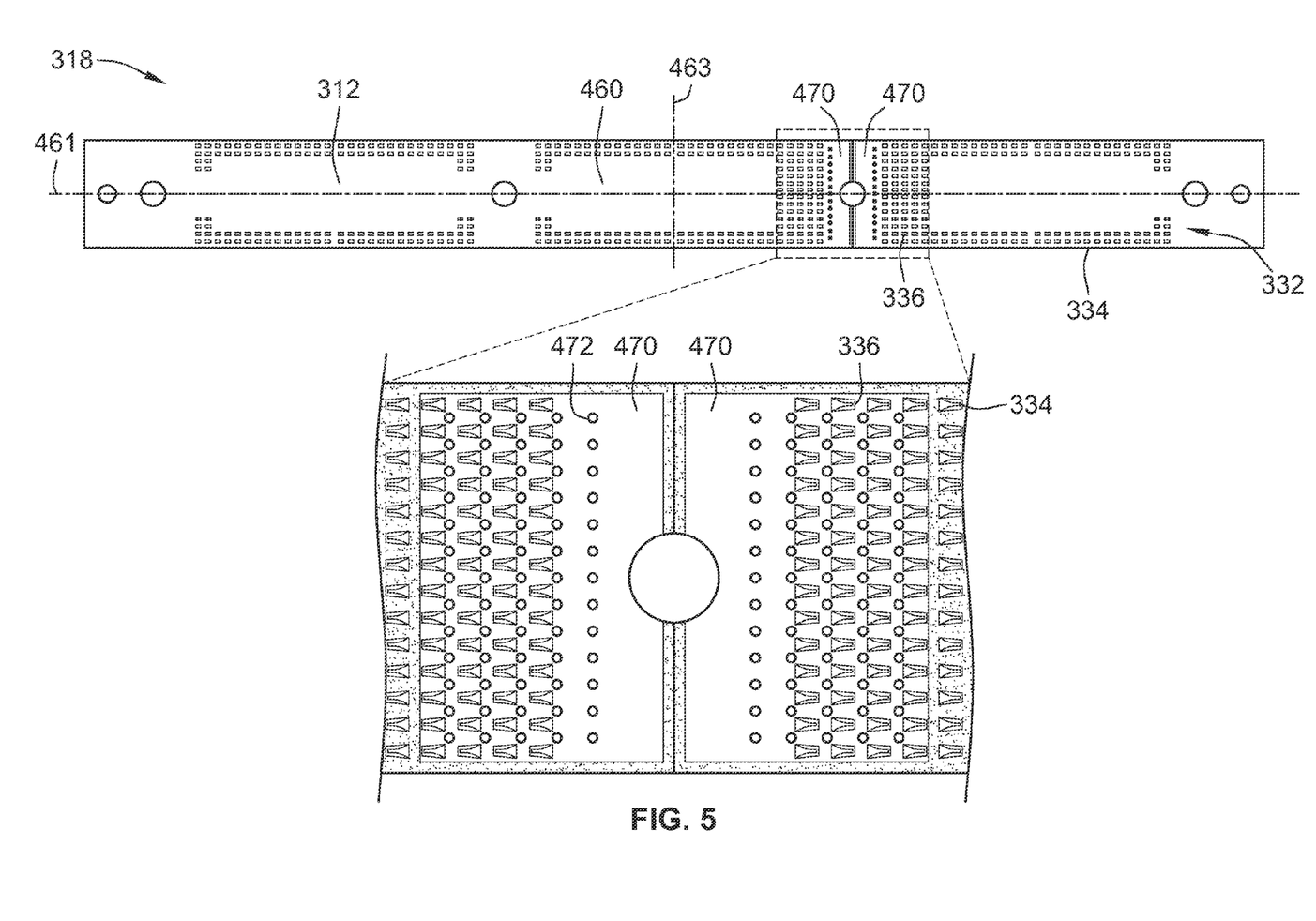
FIG. 5 is a front view of a mating interface of the interconnect assembly shown in FIG. 2.

FIG. 5 is a front view of the mating interface 312 of the interconnect assembly 318. The interconnect assembly 318 includes a substrate 460. In the illustrated embodiment, the substrate 460 is a circuit board, and may be referred to hereinafter as a circuit board 460. The substrate 460 is generally planar and extends along a longitudinal axis 461 and a lateral axis 463.

The interconnect assembly 318 includes the array of contacts 332, which includes both the signal contacts 334 and the power contacts 336. The array of contacts 332 defines a compressible interface that mates with the first electrical component, such as the primary circuit board 304 (shown in FIG. 1). The signal contacts 334 and the power contacts 336 are both supported by the substrate 460. In an exemplary embodiment, the signal contacts 334 and the power contacts 336 are substantially identically formed. The signal and power contacts 334, 336 are small contacts extending outward from the substrate 460.

In an exemplary embodiment, the signal and power contacts 334, 336 have substantially similar sizes, shapes and cross-sections. The signal and power contacts 334, 336 have similar contact areas at the mating interface for mating with the first electrical component. The signal and power contacts 334, 336 have similar current ratings and thus similar current carrying capabilities. Multiple power contacts 336 are utilized in combination to convey a sufficient amount of power for the particular application. The number of power contacts 336 may be selected based on the amount of power needed to be transferred across the mating interface. For example, the power conveying capacity of the combination of power contacts 336 is the aggregate of each of the individual power contacts 336. As such, more power contacts 336 may be provided when the particular application has a higher power requirement.

Optionally, the signal contacts 334 may be grouped together in one or more contact subsets such that a plurality of the signal contacts 334 are adjacent one another. For example, the signal contacts 334 may be arranged in columns and rows. Any number of signal contacts 334 may be arranged in the contact subsets, and the signal contacts 334 may have any pattern, depending on the particular application. Similarly, the power contacts 336 may be grouped together in contact subsets such that a plurality of the power contacts 336 are adjacent one another. The power contacts 336 may be arranged in columns and rows. Any number of power contacts 336 may be arranged in the contact subsets, and the power contacts 336 may have any pattern, depending on the particular application. The columns of signal and power contacts 334, 336 are spaced apart from one another along the longitudinal axis 461 and the rows of signal and power contacts 334, 336 are spaced apart from one another along the lateral axis 463.

Figure 6:
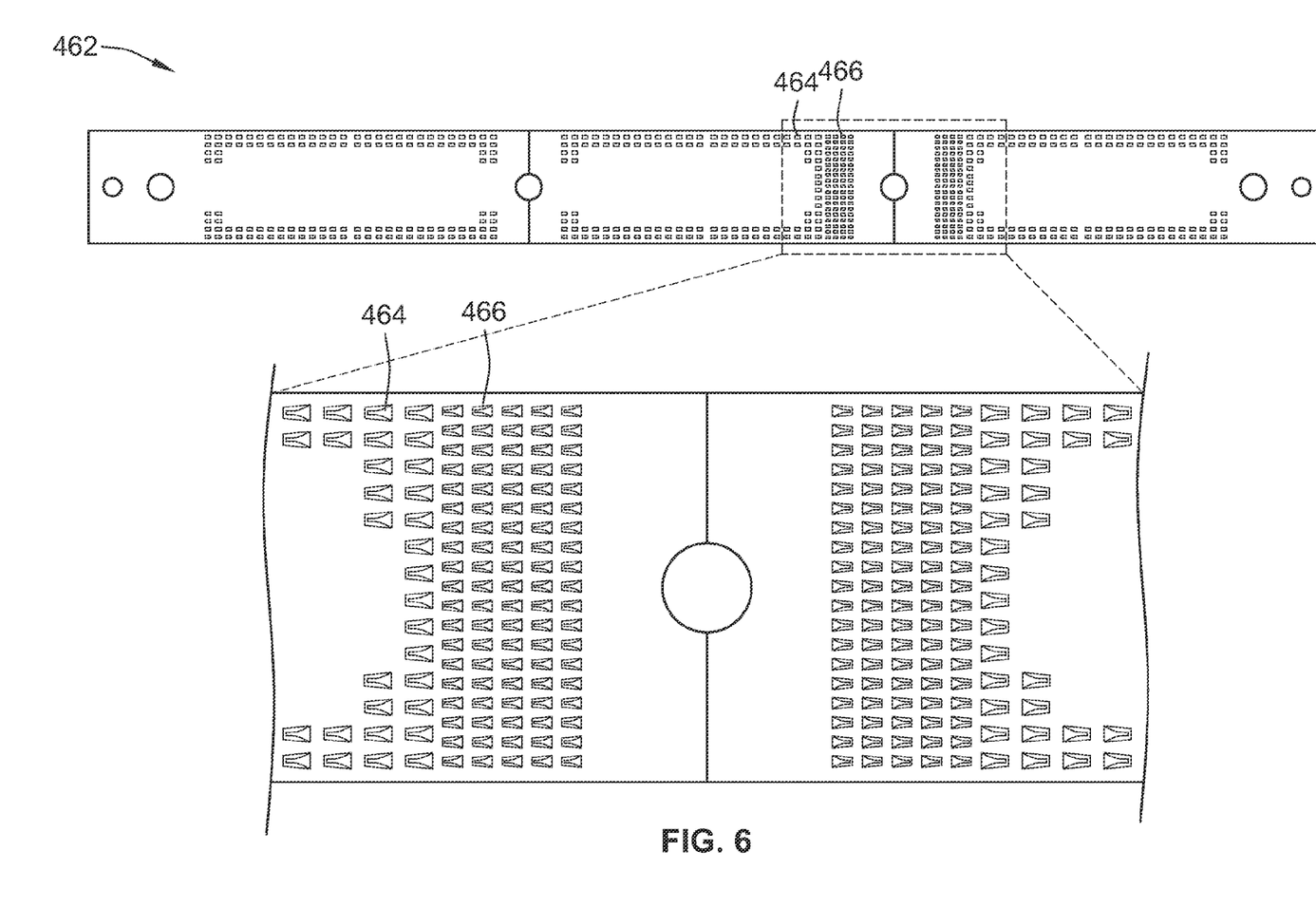
FIG. 6 is a front view of an alternative interconnect assembly.

In the illustrated embodiment, the power contacts 336 have the same longitudinal pitch as the signal contacts 334 along the longitudinal axis 461 and the power contacts 336 have the same lateral pitch as the signal contacts 334 along the lateral axis 463. However, in an alternative embodiment, the power contacts 336 may have a different longitudinal pitch and/or lateral pitch as the signal contacts 334. For example, FIG. 6 illustrates an alternative interconnect assembly 462 having signal contacts 464 and power contacts 466 arranged in a different pattern than the embodiment shown in FIG. 5. The power contacts 466 have a tighter longitudinal pitch than the signal contacts 464. The power contacts 466 have a tighter lateral pitch than the signal contacts 464. As such, the power contacts 466 have a higher density than the signal contacts 464. The density of the power contacts 466 may affect the amount of power that may be transferred across the interface. The density of the power contacts 466 may affect the heat dissipation of the power contacts 466.

Returning to FIG. 5, the interconnect assembly 318 includes a metal plate 470 in each of the areas of the power contacts 336. Each of the power contacts 336 is electrically connected to the plate 470. As such, the plate 470 electrically commons a plurality of the power contacts 336 together. The power contacts 336 are bussed together by the plate 470. Optionally, the power contacts 336 may be integrally formed with the plate 470. Alternatively, the power contacts 336 may be separate and distinct from the plate 470, but be physically coupled to the plate 470. In an exemplary embodiment, the plate 470 may represent one layer of the circuit board 460 such that the plate 470 is an integral part of the circuit board 460. The plate 470 may be an exterior layer of the circuit board 460 such that the plate 470 is exposed on an exterior surface of the circuit board 460. Alternatively, the plate 470 may be an interior layer of the circuit board 460 or may be covered by a dielectric material such as a coverlay. In an alternative embodiment, rather than being a layer of the circuit board 460, the plate 470 may be separately manufactured from the circuit board 460 and coupled to the circuit board 460 during an assembly step. In an exemplary embodiment, the plate 470 also functions as a heat sink that dissipates heat from the power contacts 336.

In an exemplary embodiment, the interconnect assembly 318 includes multiple plates 470. For example, the plates 470 may be arranged in sets on opposite sides of the substrate 460. The plates 470 in each set are electrically connected to one another and transfer power therebetween to the power contacts 336 on both sides of the substrate 460. Additionally, the plates 470 are arranged next to one another on the same side of the substrate 460 in pairs. One of the plates 470 within each pair may carry a positive current. The other plate 470 within each pair may carry a negative current or ground plane. In some embodiments, each area may include multiple plates 470 arranged together, where each plate includes multiple contacts associated therewith. As such, multiple power contacts 336 are bussed together using the plates 470. Optionally, the plates 470 may function as a heat sink, or as part of a heat dissipation circuit for dissipating heat from the interface area. The plates 470 may be thermally connected to a separate component the operates to dissipate heat therefrom.

The substrate 460 includes a plurality of vias 472 that extend therethrough. The vias 472 are arranged in the area of the power contacts 336 and the plates 470. The vias 472 may also be arranged in the area of the signal contacts 334. The vias 472 extend at least partially through the substrate 460. In an exemplary embodiment, the vias 472 are plated and define a conductive pathway through the substrate 460. Alternatively, the vias 472 may be filled with a conductive material, such as a slurry, paste, epoxy, slug and the like. In an exemplary embodiment, the plates 470 are electrically connected to the vias 472 such that power is transferred from plates 470 on one side of the substrate 460 to a corresponding plate 470 on the other side of the substrate 460. The number and positioning of the vias 472 may vary depending on the particular application. Having many vias 472 decreases the overall resistance from the power contacts 336 on one side of the substrate 460 to the power contacts on the other side of the substrate 460, which may also reduce the amount of heat generated. Optionally, a via 472 may be positioned between each adjacent power contact 366. The addition of many vias creates an optimal conduction path through the substrate 460. In an alternative embodiment, large diameter vias may be used to provide a conduction path through the substrate 460. The plates 470 may be electrically connected to the vias 472 by a conductive joint, such as a solder joint, a conductive adhesive, a conductive epoxy, a pin, or other means.

In an alternative embodiment, rather than having plates 470, the power contacts 336 may be separate from one another and not electrically connected by a common metal plate. The power contacts 336 may instead pass from one side of the substrate 460 to the other side of the substrate 460. Each power contact 336 may engage both electrical components connected by the interconnect assembly 318. The power contacts 336 transfer power directly between the two electrical components. In such an embodiment, the power contacts 336 may be sized or shaped differently than in the illustrated embodiments to accommodate the current capacity required of the interconnect assembly.

Returning to FIG. 6, the power contacts 466 may be bussed together, such as by using one or more plates on the surface of the substrate. FIG. 6 illustrates the interconnect assembly 462 with a coverlay on the top surface thereof, thus hiding the power plate. The power contacts 466 are exposed through the coverlay and are connected to corresponding power contacts on the other side of the substrate by the circuit board. For example, the circuit board may include a plurality of vias (not shown) similar to the embodiment of FIG. 5, where the vias transfer the electrical power from one side of the board to the other side of the board, and thus from one plate to the other plate. The number and positioning of the vias may vary depending on the particular application. Having many vias decreases the overall resistance from the power contacts on one side to the power contacts on the other side, which may also reduce the amount of heat generated.

Figure 7:
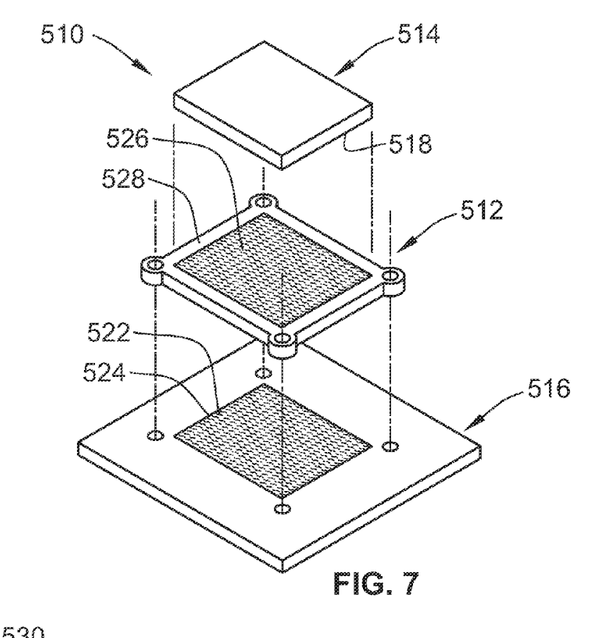
FIG. 7 illustrates another alternative interconnect assembly.

FIG. 7 illustrates an alternative electrical system 510 that utilizes an interconnect assembly 512 formed in accordance with an exemplary embodiment. The interconnect assembly 512 is used to interconnect a first electrical component 514 with a second electrical component 516. In the illustrated embodiment, the electrical component 514 is represented by an integrated circuit (IC) component such as an electronic package in the form of a chip or other circuitized module. The electrical component 516 is represented by a printed circuit board (PCB). The electronic package and PCB are merely illustrative of exemplary electrical components that may be interconnected by the interconnect assembly 512. Other types of electrical components may be similarly interconnected by the interconnect assembly 512 in alternative embodiments. For example, the interconnect assembly 512 may be used to interconnect two PCBs or two electronic packages in alternative embodiments. The interconnect assembly 512 may be used to interconnect a circuit board and a flexible circuit, or two flexible circuits together.

The electrical component 514 includes a component mating face 518 for mating with the interconnect assembly 512. The component mating face 518 includes an array of mating elements, such as conductive pads, traces or contacts. The mating elements are arranged in a predetermined pattern for mating with the interconnect assembly 512. The mating elements may include both signal elements that are part of a data circuit and power elements that are part of a power circuit. The electrical component 516 includes a component mating face 522 for mating with the interconnect assembly 512. The component mating face 522 includes an array of mating elements 524, such as conductive pads, traces or contacts. The mating elements 524 are arranged in a predetermined pattern for mating with the interconnect assembly 512. The mating elements may include both signal elements that are part of a data circuit and power elements that are part of a power circuit.

The interconnect assembly 512 may be used to simultaneously connect to both the signal elements and the power elements of the electrical components 514, 516. The interconnect assembly 512 is used to transfer data signals between corresponding ones of the signal elements. The interconnect assembly 512 is used to transfer power between corresponding ones of the power elements.

The interconnect assembly 512 includes a substrate 526 and a socket frame 528 holding the substrate 526. The socket frame 528 may be attached to the electrical component 516 to position the interconnect assembly 512 with respect to the electrical component 516. The socket frame 528 is configured to hold the electrical component 514 therein. The electrical component 514 may be directly secured to the socket frame 528, or alternatively, a fastener or plate may be used to secure the electrical component 514 to the socket frame 528 and/or the electrical component 516. The socket frame 528 may be used to position the electrical component 514 with respect to the interconnect assembly 512.

Figure 8:
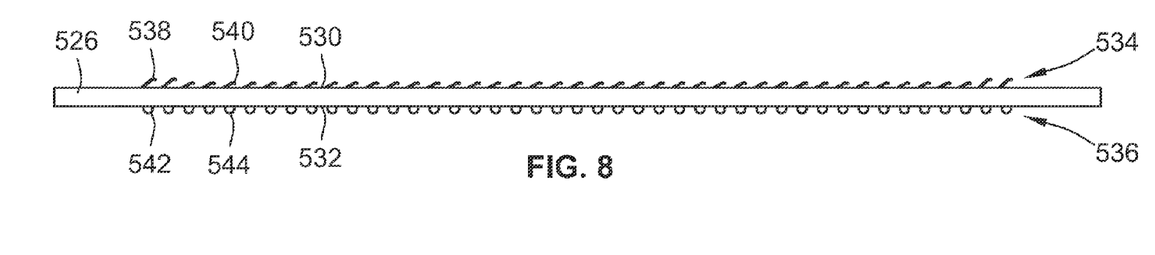
FIG. 8 is a top view of the interconnect assembly shown in FIG. 7.

FIG. 8 is a side view of the interconnect assembly 512 illustrating the substrate 526 with the socket frame 528 (shown in FIG. 7) removed for clarity. Optionally, the interconnect assembly 512 may be utilized without the use of the socket frame 528 to interconnect the electrical components 514, 516 (shown in FIG. 7).

The interconnect assembly 512 includes opposed first and second surfaces 530, 532. When assembled, the first surface 530 generally faces the electrical component 514 and the second surface 532 generally faces the electrical component 516 (shown in FIG. 7). The interconnect assembly 512 includes a first array of contacts 534 provided on and/or extending from the surface 530. The interconnect assembly 512 includes a second array of contacts 536 provided on and/or extending from the surface 532.

The first array of contacts 534 includes both signal contacts 538 and power contacts 540. The signal contacts 538 are configured to electrically connect to corresponding signal mating elements on the electrical component mating face 518 (shown in FIG. 7). The power contacts 540 are configured to electrically connect to corresponding power mating elements on the electrical component mating face 518. Similarly, the second array of contacts 536 includes both signal contacts 542 and power contacts 544. The signal contacts 542 are configured to electrically connect to corresponding signal mating elements 524 (shown in FIG. 7) on the second electrical component mating face 522 (shown in FIG. 7). The power contacts 544 are configured to electrically connect to corresponding power mating elements 524 on the second electrical component mating face 522.

In an exemplary embodiment, the contacts 534 are separately provided from, and electrically connected to, the contacts 536. Alternatively, the contacts 534 may be integrally formed with the contacts 536 such that a portion of each contact is provided at the surface 530 and a portion of each contact is also provided at the surface 532. In the illustrated embodiment, the contacts 534 may represent spring contacts extending from the surface 530 and the contacts 536 may represent solder balls extending from the surface 532. The spring type contacts constitute a compressible interface that may be easily separable for mating and unmating multiple times, whereas the solder ball type of contacts constitute a non-separable interface after the solder balls are soldered to the corresponding electrical component to make a permanent connection thereto. Other types of contacts may be provided at either surface 530, 532 in alternative embodiments. For example, both contacts 534, 536 may represent spring contacts, thus defining two separable interfaces. Other types of contacts may be used to create a separable interface.

Figure 9:
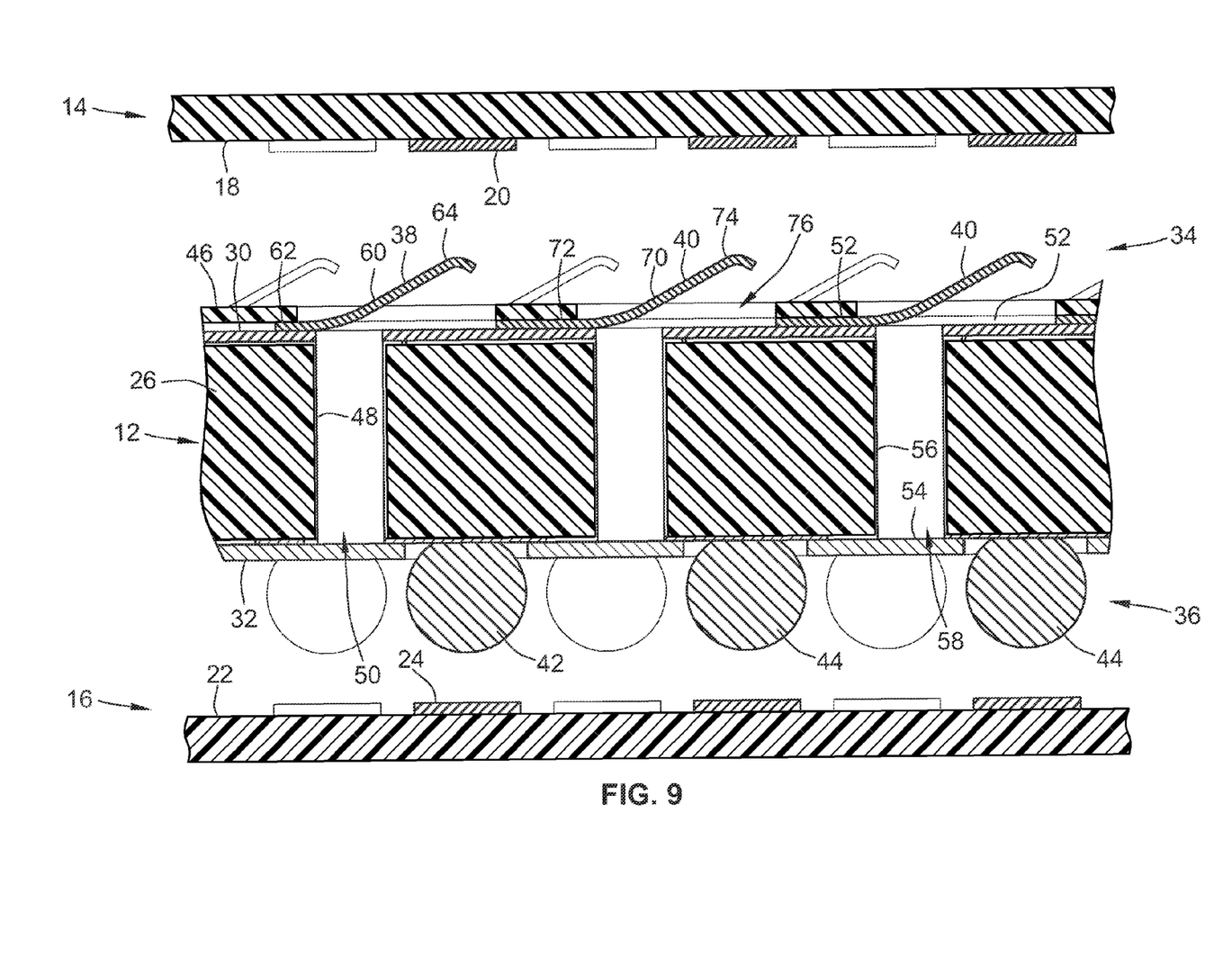
FIG. 9 is a cross-sectional view of an alternative interconnect assembly formed in accordance with an exemplary embodiment.

FIG. 9 is a cross-sectional view of a portion of another interconnect assembly 12. The interconnect assembly 12 may be used within the electrical system 300 (shown in FIGS. 1-5), such as to replace the interconnect assembly 318 and/or the interconnect assembly 413, or any other interface therein depending on the particular application. Similarly, the interconnect assembly 12 may be used within the electrical system 510 (shown in FIGS. 7-8) to replace the interconnect assembly 512. The components and features of the interconnect assembly 12 may be used in whole or in part within the other interconnect assemblies or interfaces described herein.

The interconnect assembly 12 is used to interconnect a first electrical component 14 with a second electrical component 16. The electrical component 14 includes a component mating face 18 for mating with the interconnect assembly 12. The component mating face 18 includes an array of mating elements 20, such as conductive pads, traces or contacts. The mating elements may include both signal elements that are part of a data circuit and power elements that are part of a power circuit. The electrical component 16 includes a component mating face 22 for mating with the interconnect assembly 12. The component mating face 22 includes an array of mating elements 24, such as conductive pads, traces or contacts. The mating elements may include both signal elements that are part of a data circuit and power elements that are part of a power circuit. In the example of the electrical system 300, the first electrical component 14 may represent the primary circuit board 304 or the secondary circuit board 306 and the second electrical component 16 may represent the flexible circuit 316.

The interconnect assembly 12 may be used to simultaneously connect to both the signal elements and the power elements of the electrical components 14, 16. The interconnect assembly 12 is used to transfer data signals between corresponding signal elements. The interconnect assembly 12 is used to transfer power between corresponding power elements.

The interconnect assembly 12 includes a substrate 26 having opposite first and second surfaces 30, 32. When assembled, the first surface 30 generally faces the electrical component 14 and the second surface 32 generally faces the electrical component 16. The interconnect assembly 12 includes a first array of contacts 34 provided on and/or extending from the surface 30. The contacts 34 are configured to electrically connect to corresponding mating elements 20 on the first electrical component mating face 18. The interconnect assembly 12 includes a second array of contacts 36 provided on and/or extending from the surface 32. The contacts 36 are configured to electrically connect to corresponding mating elements 24 on the second electrical component mating face 22. While the second array of contacts 36 are illustrated as being different than the first array of contacts 34, it is realized that the second array of contacts 36 may be the same as the first array of contacts 34 in an alternative embodiment.

The first array of contacts 34 includes both signal contacts 38 and power contacts 40. The signal contacts 38 are configured to electrically connect to corresponding signal mating elements 20 on the electrical component mating face 18. The power contacts 40 are configured to electrically connect to corresponding power mating elements 20 on the electrical component mating face 18. Similarly, the second array of contacts 36 includes both signal contacts 42 and power contacts 44. The signal contacts 42 are configured to electrically connect to corresponding signal mating elements 24 on the second electrical component mating face 22. The power contacts 44 are configured to electrically connect to corresponding power mating elements 24 on the second electrical component mating face 22.

In an exemplary embodiment, the contacts 34 are separately provided from, and electrically connected to, the contacts 36. Alternatively, the contacts 34 may be integrally formed with the contacts 36 such that a portion of each contact is provided at the surface 30 and a portion of each contact is also provided at the surface 32. In the illustrated embodiment, the contacts 34 may represent spring contacts extending from the surface 30 and the contacts 36 may represent solder balls extending from the surface 32. The spring type contacts constitute a compressible interface that may be easily separable for mating and unmating multiple times, whereas the solder ball type of contacts constitute a non-separable interface as the solder balls are soldered to the corresponding electrical component to make a permanent connection thereto. Other types of contacts may be provided at either surface 30, 32 in alternative embodiments. For example, both contacts 34, 36 may represent spring contacts, thus defining two separable interfaces. Other types of contacts may be used to create a separable interface.

In the illustrated embodiment, the signal contacts 38 are secured to the substrate 26. Optionally, the signal contacts 38 may be formed from a conductive layer of the substrate 26. A coverlay 46 extends over portions of the signal contacts 38. Optionally, the signal contacts 38 may form part of a flexible circuit overlaying a rigid substrate. The signal contacts 38 may extend outward from the flexible circuit for mating with the mating elements 20. In an exemplary embodiment, conductive traces 48 are provided on and/or routed through the substrate 26 to interconnect the signal contacts 38 and the signal contacts 42. Optionally, vias or through holes 50 may extend through the substrate 26, and the conductive traces 48 may extend from the surface 30 to the surface 32 through the via 50.

The power contacts 40 are secured to the substrate 26. Optionally, the power contacts 40 may be formed from a conductive layer of the substrate 26. The coverlay 46 extends over portions of the power contacts 40. The power contacts 40 may be integrally formed with a metal plate 52 that is either part of the substrate 26 or is coupled to the substrate 26. A second plate 54 is provided on the other side of the substrate 26. The power contacts 44 are coupled to the second plate 54. In an exemplary embodiment, conductive traces 56 are provided on and/or routed through the substrate 26 to interconnect the power contacts 40 and the power contacts 44. Optionally, vias or through holes 58 may extend through the substrate 26, and the conductive traces 56 may extend from the first plate 52 to the second plate 54 through the via 58. The via 58 may be either plated or filled with a conductive plug to create a conductive path between the first and second plates 52, 54.

In an exemplary embodiment, the first and second plates 52, 54 function as heat sinks that dissipate heat. The first and second plates may be provided near or at the surfaces 30, 32 to facilitate dissipating heat generated by the power contacts 40, 44. Optionally, a separate heat sink component may be thermally coupled to the plates 52, 54 to further aide in dissipating heat. The separate heat sink component may be part of the first and second electrical components that are coupled to the interconnect assembly 12.

Each of the signal contacts 38 includes a beam 60 extending between a base 62 and a tip portion 64. The beams 60 extend from the substrate 26 at an angle. The base 62 is securely coupled to the substrate 26. The base 62 is electrically connected to the conductive trace 48 to create the electrical path to the signal contacts 42. Optionally, a separate conductive element (not shown) may be provided between the signal contact 38 and the conductive trace 48 to create a conductive path therebetween.

Each of the power contacts 40 includes a beam 70 extending between a base 72 and a tip portion 74. The beams 70 extend from the substrate 26 at an angle, which may be the same as or different than the angle of the signal contacts 38. The base 72 is integrally formed with the first plate 52. The base 72 is electrically connected to the conductive trace 56 either directly or via the first plate 52 to create the electrical path to the power contacts 44. Optionally, the power contacts 40 may be positioned such that the power contacts 40 are configured to engage the first electrical component 14 prior to the signal contacts 38 in a sequenced mating scheme. For example, the power contacts 40 may be longer than the signal contacts 38 and/or the power contacts 40 may be angled differently than the signal contacts 38.

The coverlay 46 includes a plurality of openings 76. The signal contacts 38 and the power contacts 40 are received in corresponding ones of the openings 76. In the unmated state, the tip portions 64, 74 are elevated above the outer surface of the coverlay 46. When mated, the signal and power contacts 38, 40 are compressed such that the tip portions 64, 74 are received in the openings 76 and substantially coplanar with the outer surface of the coverlay 46. When compressed, the angles at which the signal and power contacts 38, 40 extend are changed. The coverlay 46 acts as an overstress protection device that limits the amount of stress on the signal and power contacts 38, 40.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An interconnect assembly for interconnecting first and second electrical components, the interconnect assembly comprising:
    a substrate having opposed first and second surfaces;
    a first array of contacts on the first surface for engaging corresponding elements on the first electrical component, the first array of contacts having bases mounted to the first surface and beams extending from the bases, the first array of contacts defines a compressible interface that mates with the first electrical component, the first array of contacts comprising signal contacts transferring data signals across the compressible interface and the first array of contacts comprising a combination of power contacts grouped together in a separate area of the substrate from the signal contacts that jointly convey power across the compressible interface, the bases of the power contacts and the bases of the signal contacts being coplanar along the first surface of the substrate; and
    a second array of contacts on the second surface for engaging corresponding elements on the second electrical component, the second array of contacts having signal contacts electrically connected to the signal contact of the first array of contacts and power contacts electrically connected to the power contacts of the first array of contacts.

2. The interconnect assembly of claim 1, wherein the compressible interface defined by the first array of contacts is separable from the first electrical component such that both the signal contacts and the power contacts are configured to be separated from the first electrical component when the substrate and the first electrical component are moved apart from one another.

3. The interconnect assembly of claim 1, wherein the power contacts are electrically connected to one another by a common plate.

4. The interconnect assembly of claim 1, wherein the substrate comprises a circuit board having vias extending between the first and second surfaces, the signal contacts of the first array of contacts being electrically connected to corresponding signal contacts of the second array of contacts through corresponding vias, the power contacts of the first array of contacts being electrically connected to the power contacts of the second array of contacts through the vias.

5. The interconnect assembly of claim 1, further comprising a metal plate at the first surface of the substrate, the power contacts being integrally formed with the metal plate such that the power contacts are electrically commoned, the power conveying capacity of the combination of power contacts being the aggregate of each of the individual power contacts.

6. The interconnect assembly of claim 1, further comprising a first metal plate at the first surface of the substrate and a second metal plate at the second surface of the substrate, the first and second metal plates being electrically connected to one another by plated via holes through the substrate, the power contact of the first array of contacts being electrically connected to, and extending outward from, the first metal plate, the power contact of the second array of contacts being electrically connected to, and extending outward from, the second metal plate.

7. The interconnect assembly of claim 1, wherein the first surface of the substrate extends along a longitudinal axis and a lateral axis, the signal contacts having a longitudinal pitch and a lateral pitch between adjacent signal contacts, the power contacts having a longitudinal pitch and a lateral pitch between adjacent power contacts, the longitudinal and lateral pitches of the power contacts being tighter than the longitudinal and lateral pitches of the signal contacts.

8. The interconnect assembly of claim 1, wherein the first array of contacts each include a beam extending at an angle with respect to the first surface to a tip portion, the tip portion defining the compressible interface, the first array of contacts being compressed toward the substrate when mated with the first electrical component such that the angle of the beam is changed.

9. The interconnect assembly of claim 1, wherein the number of power contacts of the first array of contacts is substantially similar to the number of signal contacts of the first array of contacts.

10. The interconnect assembly of claim 1, wherein the power and signal contacts of the first array of contacts are grouped together in separate areas of the substrate such that the signal contacts are not interspersed with the power contacts.

11. The interconnect assembly of claim 1, further comprising a first metal plate at the first surface of the substrate and a second metal plate at the second surface of the substrate, the first and second metal plates being electrically connected to one another by plated via holes through the substrate, the number of plated via holes being greater than the number of power contacts in the first array of contacts.

12. The interconnect assembly of claim 1, further comprising a first metal plate at the first surface of the substrate and a second metal plate at the second surface of the substrate, the first and second metal plates being electrically connected to one another by plated via holes through the substrate, a first subset of the plated via holes being aligned with corresponding power contacts, a second subset of the plated via holes being arranged in the interstitial spaces between the first subset of the plated via holes such that the number of plated via holes far exceeds the number of power contacts in the first array of contacts.

13. The interconnect assembly of claim 1, further comprising a positive electrode metal plate at the first surface of the substrate and a negative electrode metal plate at the first surface of the substrate, each of the positive and negative electrode metal plates having corresponding power contacts being electrically connected to one another by such corresponding positive or negative electrode metal plate, the positive and negative electrode metal plates being offset with respect to areas of the substrate having the signal contacts.

14. An interconnect assembly for interconnecting first and second electrical components, the interconnect assembly comprising:
    a substrate having opposed first and second surfaces having dedicated signal transmission areas and dedicated power transmission areas separate from the signal transmission areas;
    signal contacts defining a first signal interface at a corresponding signal transmission area of the first surface for engaging corresponding elements on the first electrical component, and the signal contacts defining a second signal interface at a corresponding signal transmission area of the second surface for engaging corresponding elements on the second electrical component, the signal contacts at the first surface being electrically connected to the signal contacts at the second surface through the substrate, the signal contacts having bases mounted to the first surface and beams extending from the bases; and
    power contacts at a corresponding power transmission area for transferring power through the substrate, the power contacts being similarly sized as the signal contacts and the power contacts being similarly shaped as the signal contacts, the power contacts being configured to engage corresponding elements on the first and second electrical components to transfer power between the first and second electrical components, the power contacts having bases mounted to the first surface and beams extending from the bases, the bases of the power contacts being coplanar with the bases of the signal contacts.

15. The interconnect assembly of claim 14, wherein the substrate comprises a circuit board having vias extending between the first and second surfaces, the signal contacts defining the first signal interface being electrically connected to corresponding signal contacts defining the second signal interface through corresponding vias, the power contacts transferring power through the substrate using the vias.

16. The interconnect assembly of claim 14, further comprising a first metal plate at a corresponding power transmission area on the first surface of the substrate and a second metal plate at such power transmission area on the second surface of the substrate, the first and second metal plates being electrically connected to one another by plated via holes through the substrate, a first subset of the plated via holes being aligned with corresponding power contacts, a second subset of the plated via holes being arranged in the interstitial spaces between the first subset of the plated via holes such that the number of plated via holes far exceeds the number of power contacts along the first or second surface in the corresponding power transmission area of the substrate.

17. An interconnect assembly for interconnecting first and second electrical components, the interconnect assembly comprising:
    a substrate having opposed first and second surfaces;
    a first array of contacts on the first surface for engaging corresponding elements on the first electrical component, the first array of contacts defines a compressible interface that mates with the first electrical component, the first array of contacts having bases mounted to the first surface and beams extending from the bases, the first array of contacts comprising signal contacts transferring data signals across the compressible interface and the first array of contacts comprising a combination of power contacts that jointly convey power across the compressible interface, the power contacts being integrally formed with, and electrically connected to one another by, a common plate on the first surface, the bases of the power contacts and the bases of the signal contacts being coplanar along the first surface of the substrate; and
    a second array of contacts on the second surface for engaging corresponding elements on the second electrical component, the second array of contacts being electrically connected to the first array of contacts through the substrate.

18. The interconnect assembly of claim 17, wherein the substrate comprises a circuit board, at least a portion of one layer of the circuit board defining the common plate.

19. The interconnect assembly of claim 17, wherein the substrate comprises a circuit board having vias extending between the first and second surfaces, the signal contacts defining the first signal interface being electrically connected to corresponding contacts of the second array of contacts through corresponding vias, the power contacts being electrically connected to corresponding contacts of the second array of contacts through vias.

20. The interconnect assembly of claim 17, wherein the first array of contacts each include a beam extending at an angle with respect to the first surface to a tip portion, the tip portion defining the compressible interface, the first array of contacts being compressed toward the substrate when mated with the first electrical component such that the angle of the beam is changed.

* * * * *